United States Patent
Hirano et al.

(10) Patent No.: US 6,917,103 B2
(45) Date of Patent: Jul. 12, 2005

(54) MOLDED SEMICONDUCTOR POWER DEVICE HAVING HEAT SINKS EXPOSED ON ONE SURFACE

(75) Inventors: Naohiko Hirano, Okazaki (JP);
Takanori Teshima, Okazaki (JP);
Yoshimi Nakase, Anjo (JP); Shoji Miura, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/326,555

(22) Filed: Dec. 23, 2002

(65) Prior Publication Data
US 2003/0122232 A1 Jul. 3, 2003

(30) Foreign Application Priority Data

Dec. 27, 2001 (JP) ........................................ 2001-397543
Oct. 28, 2002 (JP) ........................................ 2002-312615

(51) Int. Cl.⁷ ............................................... H01L 23/34
(52) U.S. Cl. ........................ 257/707; 257/675; 257/678
(58) Field of Search ................................ 257/678, 625, 257/675, 706, 707, 717, 720, 796, 107, 777, 666

(56) References Cited

U.S. PATENT DOCUMENTS

| | | | |
|---|---|---|---|
| 5,594,282 A | * | 1/1997 | Otsuki ........................ 257/796 |
| 6,204,554 B1 | * | 3/2001 | Ewer et al. .................. 257/705 |
| 6,215,176 B1 | * | 4/2001 | Huang ........................ 257/666 |
| 6,486,554 B2 | * | 11/2002 | Johnson ...................... 257/738 |
| 6,590,281 B2 | * | 7/2003 | Wu et al. .................... 257/684 |
| 6,597,059 B1 | * | 7/2003 | McCann et al. ............. 257/673 |
| 2003/0011054 A1 | * | 1/2003 | Jeun et al. ................... 257/678 |
| 2003/0178719 A1 | * | 9/2003 | Combs et al. ............... 257/704 |

FOREIGN PATENT DOCUMENTS

| | | | |
|---|---|---|---|
| JP | U-01-112053 | 7/1989 | |
| JP | 06097326 A | * 4/1994 | .......... H01L/23/29 |
| JP | A-8-139241 | 5/1996 | |
| JP | A-2000-223634 | 8/2000 | |
| JP | A-2001-298142 | 10/2001 | |
| JP | A-2002-33430 | 1/2002 | |
| JP | 2002033430 | * 1/2002 | .......... H01L/23/48 |
| JP | A-2003-243594 | 8/2003 | |

OTHER PUBLICATIONS

U.S. patent application Ser. No. 09/717,227, Mamitsu et al., filed Nov. 22, 2000.
U.S. patent application Ser. No. 10/127,613, Teshima, filed Apr. 23, 2002.
U.S. patent application Ser. No. 10/201,556, Hirano et al., filed Jul. 24, 2002.
U.S. patent application Ser. No. 10/211, 246, Okura et al., filed Aug. 5, 2002.
U.S. patent application Ser. No. 10/321,365, Teshima et al., filed Dec. 18, 2002.

* cited by examiner

*Primary Examiner*—Eddie Lee
*Assistant Examiner*—Douglas W. Owens
(74) *Attorney, Agent, or Firm*—Posz Law Group, PLC

(57) ABSTRACT

A semiconductor device includes a semiconductor chip, a first heat sink, a second heat sink, and a mold resin. The first heat sink is electrically and thermally connected to a surface of the semiconductor chip for functioning as an electrode for the semiconductor chip and releasing the heat generated by the semiconductor chip. The second heat sink is electrically and thermally connected to another surface of the semiconductor chip for functioning as another electrode for the semiconductor chip and releasing the heat. The semiconductor chip and the first and second heat sinks are covered with the mold resin such that the heat sinks are exposed on a substantially flat surface of the mold resin.

19 Claims, 10 Drawing Sheets

MOLDED SEMICONDUCTOR POWER DEVICE HAVING HEAT SINKS EXPOSED ON ONE SURFACE

CROSS REFERENCE TO RELATED APPLICATION

This application is based on and incorporates herein by reference Japanese Patent Applications No. 2001-397543 filed on Dec. 27, 2001 and No. 2002-312615 filed on Oct. 28, 2002.

BACKGROUND OF THE INVENTION

The present invention relates to a semiconductor device in which a semiconductor chip generating heat is located between a pair of heat sinks and to a method for manufacturing the device.

A semiconductor chip for controlling large electric power and current generates so much heat in use that a proposed semiconductor device including the chip includes a pair of heat sinks, which are made of a metal such as copper and aluminum, to efficiently release the heat generated by the chip. As shown in FIG. 1, in a proposed semiconductor device 1, a semiconductor chip 2 and a coupler 5 are located between a first heat sink 3, or a lower heat sink 3, and a second heat sink 4, or an upper heat sink 4. The upper heat sink 4 and the coupler 5, the coupler 5 and the chip 2, and the chip 2 and the lower heat sink 3 are respectively connected by solders.

The upper and lower heat sinks 4, 3 also function as electrodes for the semiconductor chip. A mold resin 6 is located between the heat sinks 3, 4 to seal the chip 2, the coupler 5, and the solders. As illustrated in FIG. 1, the upper and lower heat sinks 4, 3 are respectively exposed on the lower surface and the upper surface of the device 1. Therefore, the upper and lower heat sinks 4, 3 efficiently transmit and release the heat generated by the chip 2 while being insulated partly by the mold resin 6.

As shown in FIG. 2, the semiconductor device 1 is located in use between a cooling member 7 and a U-shaped metal fixer 9, which is connected to the cooling member 7 by male screws 10. Two insulating sheets 8 are respectively located between the cooling member 7 and the device 1 and between the device 1 and the metal fixer 9. The cooling member 7 is made of a metal such as copper and aluminum, which can efficiently transmit and release heat. Although not illustrated, the cooling member includes a cooling water passage. The metal fixer 9 is made of a metal such as copper and aluminum. The insulating sheets 8 needs to be made of an insulating material that is thermally conductive and elastically shrinkable.

In the semiconductor device 1, the upper and lower heat sinks 4, 3 are exposed, so the insulating sheets 8 are needed to insulate the exposed surfaces and the metal fixer 9 is needed to transmit the heat generated by the chip 2 from the upper heat sink 4 to the cooling member 7. Therefore, the structure of the assembled article shown in FIG. 2 is relatively complicated, and the manufacturing cost of the assembled article is relatively high.

In addition, the thickness of the semiconductor device 1 deviates to some degree. Therefore, when the semiconductor device 1 is fixed to the cooling member 7 with the metal fixer 9, it is difficult to control the force with which the metal fixer 9 presses the device 1 against the cooling member 7. When the thickness of the semiconductor device 1 deviates too much from a predetermined value, the semiconductor device 1 breaks or is not firmly fixed to the cooling member 7. If only the insulating sheets 8 absorbed the force enough, the above problem could be solved. However, no material that is elastically shrinkable enough to be used for the insulating sheets 8 has been available yet.

Moreover, in the semiconductor device 1, the heat generated by the semiconductor chip 2 is partially transmitted from the upper heat sink 4 to the cooling member 7 through one of the insulating sheets 8 and the metal fixer 9. Therefore, the heat transmission path through the upper heat sink 4 is much longer than that through the lower heat sink 3, so the upper heat sink 4 releases the heat less efficiently than the lower heat sink 3.

SUMMARY OF THE INVENTION

The present invention has been made in view of the above aspects. A first object of the present invention is to reduce the manufacturing cost of a semiconductor power device by simplifying the means for insulating a heat sink and the means for releasing heat from the heat sink. A second object of the present invention is to improve the heat releasing capability of the heat sink.

In the present invention, a semiconductor device includes a semiconductor chip, a first heat sink, a second heat sink, and a mold resin. The first heat sink is electrically and thermally connected to a surface of the semiconductor chip for functioning as an electrode for the semiconductor chip and releasing the heat generated by the semiconductor chip. The second heat sink is electrically and thermally connected to another surface of the semiconductor chip for functioning as another electrode for the semiconductor chip and releasing the heat. The semiconductor chip and the heat sinks are covered with the mold resin such that the heat sinks are exposed on a substantially flat surface of the mold resin.

With the above structure, the means for insulating the heat sinks and releasing heat from the semiconductor chip become simple, so the device is preferably cost-effective in the manufacturing and has preferable heat releasing capability.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 3:
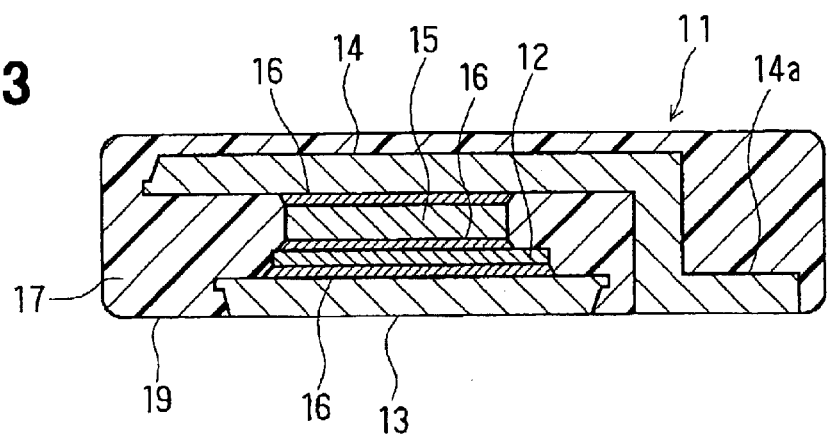
FIG. 3 is a cross-sectional view of a semiconductor device according to a first embodiment of the present invention.

As shown in FIG. 3, a semiconductor device 11 according to a first embodiment includes a semiconductor chip 12 that generates heat, a first heat sink 13, or an upper heat sink 13, a second heat sink 14, or a lower heat sink 14, a coupler 15, and a mold resin 17. Each of the upper and lower heat sinks 14, 13 is electrically and thermally connected to the semiconductor chip 12 to release the heat from the semiconductor chip and to function as an electrode for the semiconductor chip 12. The coupler 15 is located between the semiconductor chip 12 and the upper heat sink 14 to electrically and thermally connect the semiconductor chip 12 and the upper heat sink 14.

The semiconductor chip 12 is, for example, a power semiconductor such as an insulated gate bipolar transistor (IGBT) and a thyristor in the shape of, for example, a thin rectangular plate. The upper heat sink 14, the lower heat sink 13, and the coupler 15 are made of, for example, copper. Instead of copper, a metal having relatively high heat conductivity and electric conductivity such as aluminum may be used.

As illustrated in FIG. 3, a first surface, or the lower surface, of the chip 12 and the upper surface of the lower heat sink 13 are connected by a solder 16, so are a second surface, or the upper surface, of the chip 12 and the lower surface of the coupler 15, and so are the upper surface of the coupler 15 and the lower surface of the upper heat sink 14. The heat generated by the semiconductor chip 12 is transmitted and released to the outside of the semiconductor device 11 through the coupler 15 and the upper and lower heat sinks 14, 13.

The upper and lower heat sinks 14, 13 are electrically connected to the semiconductor chip 12 through the coupler 15 and the solder 16 to respectively function as, for example, a collector electrode and an emitter electrode. Although not illustrated, a control electrode of the semiconductor chip 12 such as a gate pad is electrically connected to a lead frame, which protrudes from the mold resin 17, with a bonding wire.

Each heat sink 14, 13 has a thickness of about 1 mm. The upper heat sink 14, which includes an extension 14*a*, is formed by bending a metal plate. The upper and lower heat sinks 14, 13, the coupler 15, and the solders 16 are embedded in the mold resin 17, which is made of, for example, an epoxy resin, such that the extension 14*a* and the lower heat sink 13 are exposed on the lower surface 19 of the mold resin 17 and the exposed surfaces of the extension 14*a* and the lower heat sink 13 are substantially on a common plane, as illustrated in FIG. 3. The mold resin 17 is formed by insert molding, in which the upper and lower heat sinks 14, 13, the coupler 15, and the solders 16 are molded with the epoxy resin using a pair of molds, which are not illustrated.

Figure 4A:
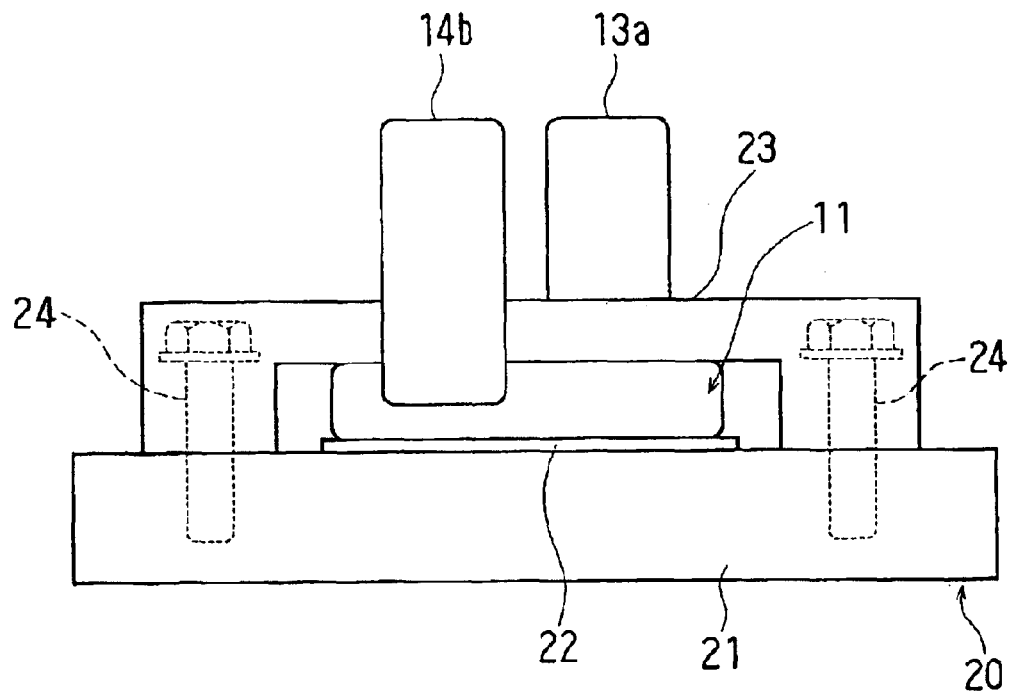
FIGS. 4A and 4B are front and side views of an article assembled with the semiconductor device of FIG. 3 and a cooling unit, respectively.
Figure 4B:
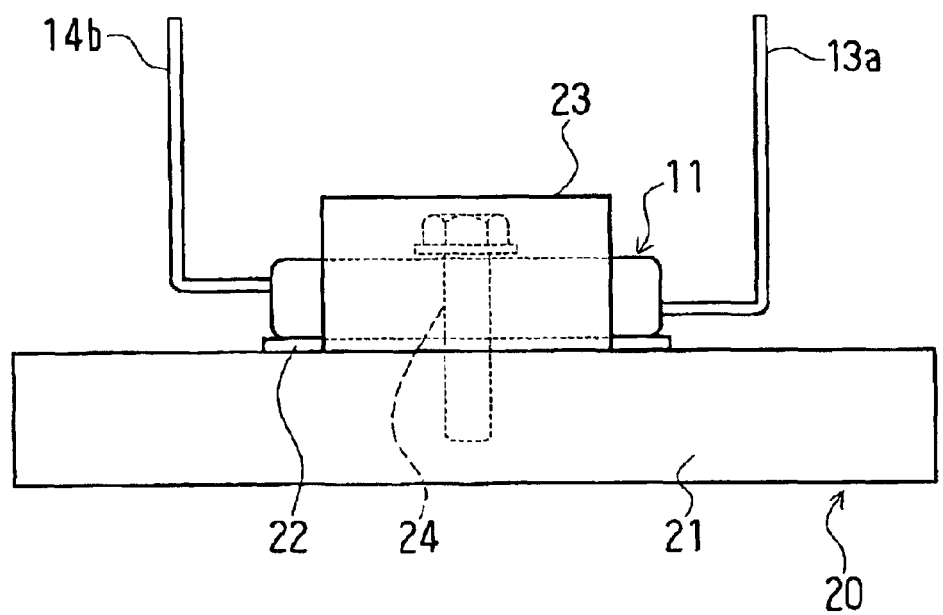

As illustrated in FIGS. 4A and 4B, the semiconductor device 11 includes two terminals 14*b*, 13*a*, which protrude from the mold resin 17. Each terminal 14*b*, 13*a* includes a horizontal portion and a vertical portion. The vertical portions do not face each other, as illustrated in FIG. 4A. The upper heat sink 14 is electrically connected to one of the terminals 14*b*, the horizontal portion of which extends frontward from a front end of the upper heat sink 14 in FIG. 3. On the other hand, the lower heat sink 13, which is a rectangular plate, is electrically connected to the other terminal 13*a*, the horizontal portion of which extends rearward from a back end of the lower heat sink 13 in FIG. 3. The coupler 15 is a rectangular plate that is slightly smaller than the semiconductor chip 12. The distance between the heat sinks 13, 14 is, for example, approximately 1 to 2 mm.

When the semiconductor device 11 is attached to a cooling unit 20 as shown in FIGS. 4A and 4B, at first, the semiconductor device 11 is placed on a cooling member 21 of the cooling unit 20 with an insulating sheet 22 between the device 11 and the cooling member 21 such that the lower surface 19 of the mold resin 17 faces the insulating sheet 22. Therefore, the exposed surfaces of the extension 14*a* and the lower heat sink 13 are respectively thermally connected to the cooling member 21 by the insulating sheet 22.

The insulating sheet 22 is made of an insulating material that is thermally conductive and elastically shrinkable to a predetermined degree. The cooling member 21 is made of a metal such as copper and aluminum, which can efficiently release heat. Although not illustrated, the cooling member 21 includes a cooling water passage.

Then, a U-shaped plastic fixer 23 is placed on a predetermined position, and the semiconductor device 1 is fixed to the cooling member 21 by tightening male screws 24 to complete the attachment of the semiconductor device 11 to the cooling unit 20.

Figure 1:
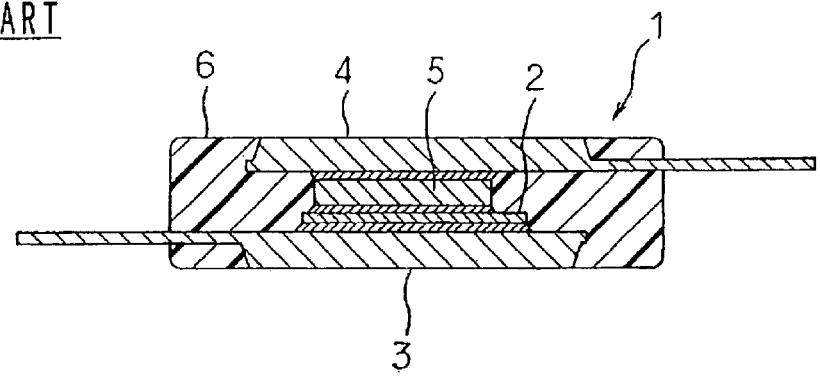
FIG. 1 is a cross-sectional view of a proposed semiconductor device.
Figure 2:
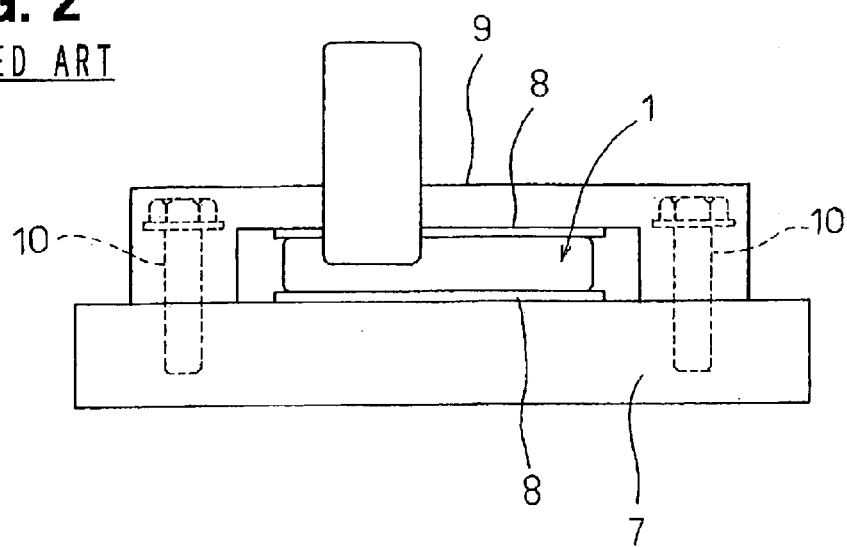
FIG. 2 is a front view of an article assembled with the proposed device and a cooling unit.

In the assembled article of FIGS. 4A and 4B, the extension 14*a* and the lower heat sink 13 are insulated by only one insulating sheet 22 at the surfaces exposed on the lower surface 19 of the mold resin 17. In addition, the plastic fixer 23 is cheaper than the metal fixer 9 of FIG. 2. Therefore, the structure of the assembled article shown in FIGS. 4A and 4B is relatively simple, and the manufacturing cost of the assembled article is relatively low.

Moreover, the heat generated by the semiconductor chip 12 is preferably transmitted and released from its two surfaces to the cooling member 21 through the coupler 15, the upper and lower heat sinks 14, 13, and the insulating sheet 22. Therefore, the net heat transmission path in the assembled article of FIGS. 4A and 4B is shorter than that in the assembled article of FIG. 2, so the heat is released more efficiently in the assembled article of FIGS. 4A and 4B than in the assembled article of FIG. 2.

Figure 5:
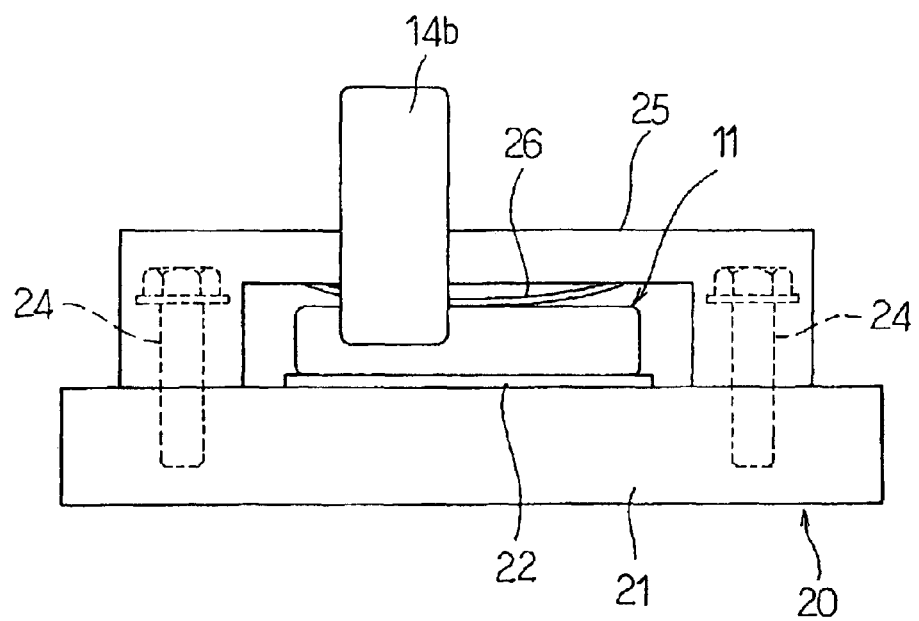
FIG. 5 is a front view of another article assembled with the semiconductor device of FIG. 3 and a cooling unit.

In the assembled article of FIGS. 4A and 4B, the plastic fixer 23 directly presses the device 11 against the cooling member 21. However, as shown in FIG. 5, a spring 26 may be located between a plastic fixer 25 and the device 11 to presses the device 11 against the cooling member 21 using the resiliency of the spring 26. The spring 26 by itself can prevent the device 11 from breaking, so a material that is not elastically shrinkable may be used for the insulating sheet 22.

Second Embodiment

Figure 6:
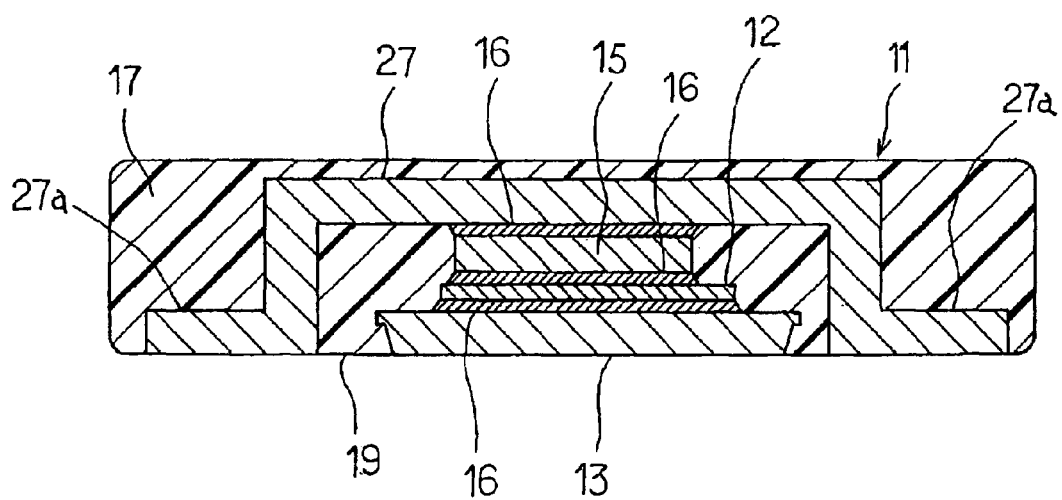
FIG. 6 is a cross-sectional view of a semiconductor device according to a second embodiment of the present invention.

As shown in FIG. 6, a semiconductor device 11 according to a second embodiment includes a first heat sink 13, or a lower heat sink 13, and a second heat sink 27, or an upper heat sink 27. The upper heat sink 27 includes two extensions 27a at its two horizontal ends, as illustrated in FIG. 6. The extensions 27a and the lower heat sink 13 are exposed on the lower surface 19 of a mold resin 17 and the exposed surfaces of the extensions 27a and the lower heat sink 13 are substantially on a common plane. In other structural aspects, the device 11 of FIG. 6 and the device 11 of FIG. 3 are the same. Therefore, the device 11 of FIG. 6 is better in heat releasing capability than the device 11 of FIG. 3 while being substantially equal to the device 11 of FIG. 3 in other effects.

Third Embodiment

Figure 7:
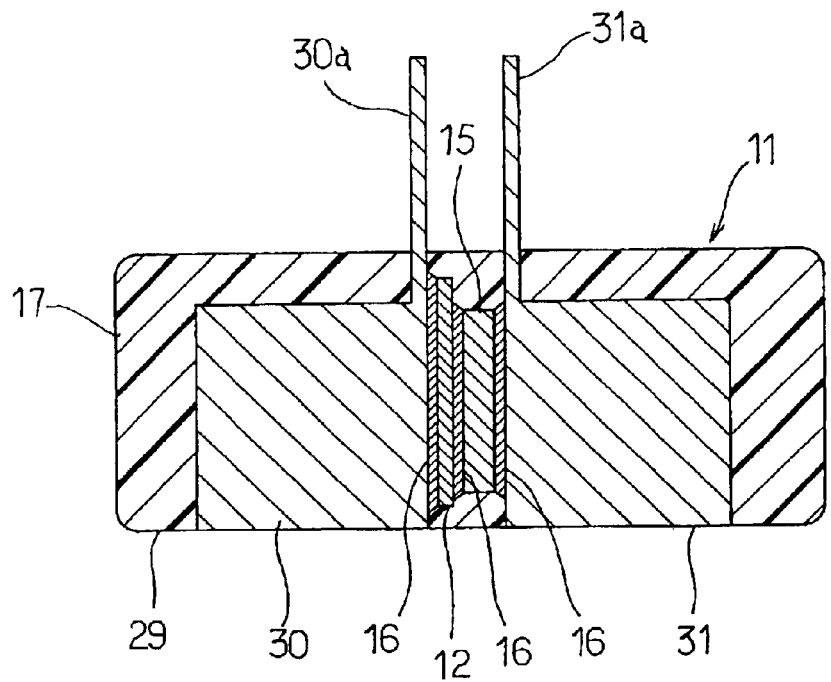
FIG. 7 is a cross-sectional view of a semiconductor device according to a third embodiment of the present invention.

As shown in FIG. 7, a semiconductor device 11 according to a third embodiment includes a semiconductor chip 12 that generates heat, a first heat sink 30, or a left heat sink 30, a second heat sink 31, or a right heat sink 31, a coupler 15, and a mold resin 17. The right heat sink 31 and the left heat sink 30 are exposed on the substantially flat lower surface 29 of the mold resin 17 and the exposed surfaces of the right heat sink 31 and the left heat sink 30 are substantially on a common plane.

As illustrated in FIG. 7, a first surface, or the left surface, of the chip 12 and the right surface of the left heat sink 30 are connected by a solder 16, so are a second surface, or the right surface, of the chip 12 and the left surface of the coupler 15, and so are the right surface of the coupler 15 and the left surface of the right heat sink 31. The left and right surfaces of the chip 12, at which the chip 12 is thermally and electrically connected to the left and right heat sinks 30, 31, are substantially perpendicular to the lower surface 29.

The left and right heat sinks 30, 31, which are approximately cubic, are made of a metal such as copper and aluminum, which is a thermally and electrically excellent conductor. As illustrated in FIG. 7, the semiconductor device 11 includes two terminals 31a, 30a, which protrude upward from the mold resin 17. The right heat sink 31 is electrically connected to one of the terminals 31a, and the left heat sink 30 is electrically connected to the other terminal 30a.

In the device 11 of FIG. 7, the heat generated by the semiconductor chip 12 is substantially equally transmitted through the left and right heat sinks 30, 31 to the outside of the semiconductor device 11. In other effects, the device 11 of FIG. 7 is substantially equal to the device 11 of FIG. 3

Fourth Embodiment

Figure 8:
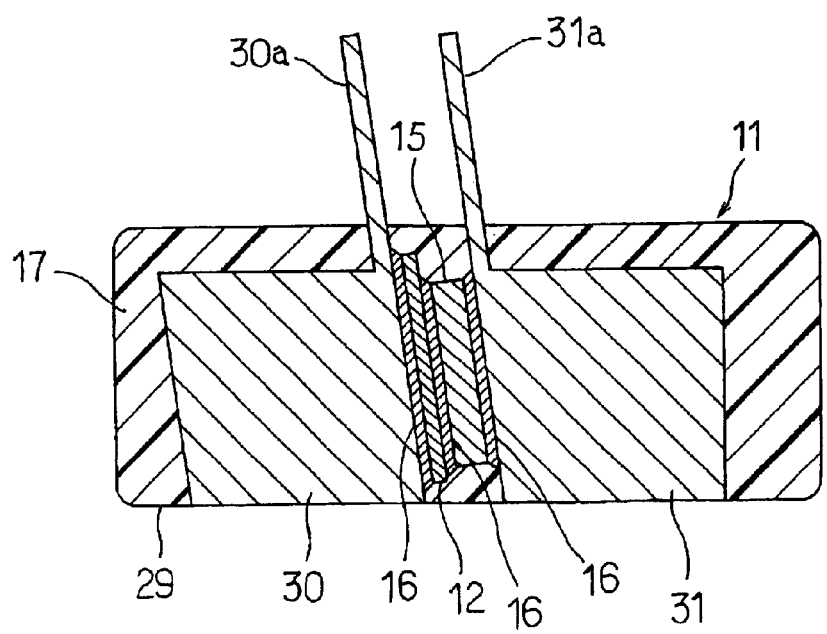
FIG. 8 is a cross-sectional view of a semiconductor device according to a fourth embodiment of the present invention.

As shown in FIG. 8, in a semiconductor device 11 according to a fourth embodiment, first and second surfaces, or the left and right surfaces, of a semiconductor chip 12, at which the chip 12 is thermally and electrically connected to first and second heat sinks 30, 31, or left and right heat sinks 30, 31, are slanted in relation to the substantially flat lower surface 29 of a mold resin 17. Therefore, the left and right heat sinks 30, 31 of FIG. 8 are different in heat releasing capability from each other. In that aspect, the device 11 of FIG. 8 is different from the device 11 of FIG. 7. In other aspects, the device 11 of FIG. 8 and the device 11 of FIG. 7 are the same, so the device 11 of FIG. 8 is substantially equal to the device 11 of FIG. 7 in other effects.

As illustrated in FIG. 8, the angle between the right surface and the bottom surface of the left heat sink 30 is smaller than that between the left surface and the bottom surface of the right heat sink 31. Therefore, the heat transmission path through the left heat sink 30 is shorter than that through the right heat sink 31, so the heat generated in the chip 12 is released more efficiently through the left heat sink 30 than through the right heat sink 31. Thus, the semiconductor device 11 of FIG. 8 performs preferably if the chip generates heat more at its left side than at its right side in FIG. 8. If the chip generates heat more at its right side than at its left side in FIG. 8, the relation in angle between the left and right heat sinks 30, 31 may be changed inversely.

Fifth Embodiment

Figure 9:
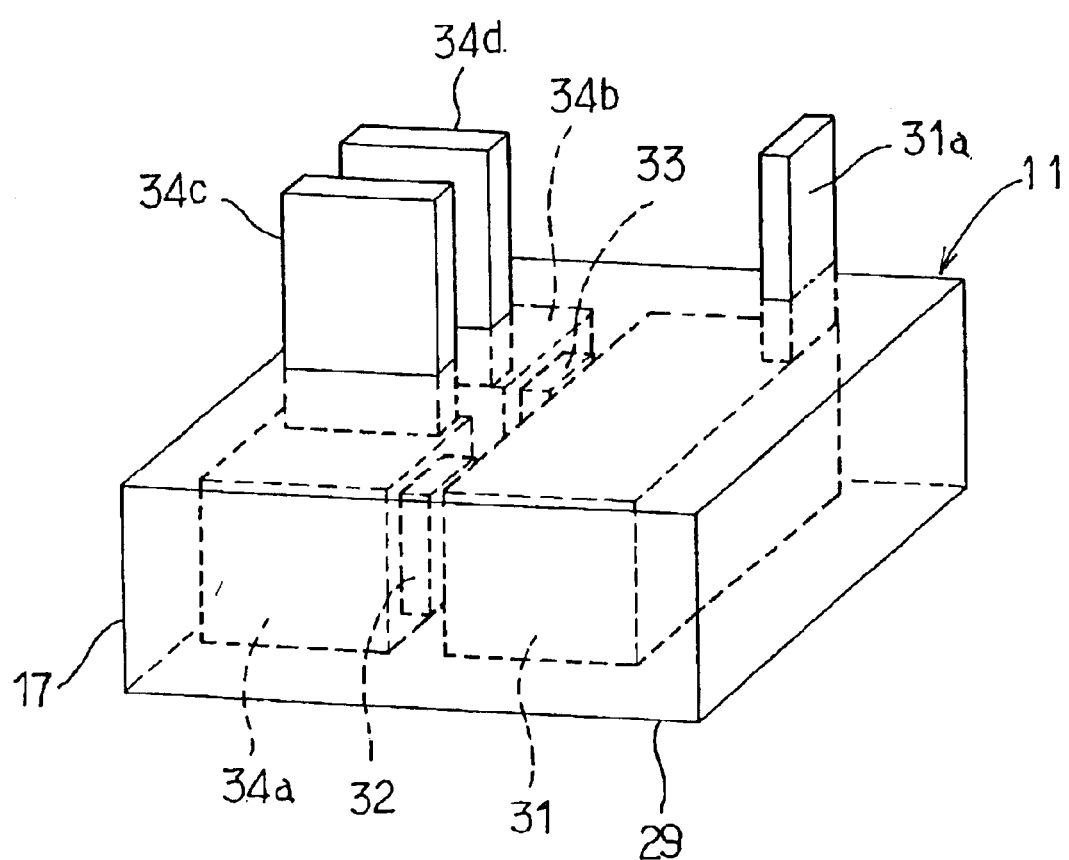
FIG. 9 is a perspective view of a semiconductor device according to a fifth embodiment of the present invention.

As shown in FIG. 9, a semiconductor device 11 according to a fifth embodiment includes two semiconductor chips 32, 33 that generate heat, two first heat sinks 34a, 34b, or two left heat sinks 34a, 34b, a second heat sink 31, or a right heat sink 31, two couplers 15, which are not shown in FIG. 9, and a mold resin 17. The right heat sink 31 and the left heat sinks 34a, 34b are exposed on the substantially flat lower surface 29 of the mold resin 17 and the exposed surfaces of the right heat sink 31 and the left heat sinks 34a, 34b are substantially on a common plane. The device 11 of FIG. 9 has substantially the same effect as the device 11 of FIG. 7.

As illustrated in FIG. 9, a first surface, or the left surface, of each chip 32, 33 and the right surface of corresponding left heat sink 34a, 34b are connected by a solder 16, so are a second surface, or the right surface, of each chip 32, 33 and the left surface of corresponding coupler 15, and so are the right surface of each coupler 15 and the left surface of the right heat sink 31. As illustrated in FIG. 9, the semiconductor device 11 includes three terminals 31a, 34c, 34d, which protrude upward from the mold resin 17. The right heat sink 31 is electrically connected to one of the terminals 31a, and the left heat sinks 34a, 34b are electrically connected to the other terminals 34c, 34d.

The device 11 of FIG. 9 is a two-in-one power module, which includes two semiconductor chips 32, 33. However, the structure of the device 11 of FIG. 9 can be also applied to a six-in-one power module, which includes six semiconductor chips. A fly-wheel diode can be preferably built into the power modules as one of the semiconductor chips.

The device 11 of FIG. 9 includes two left heat sinks 34a, 34b. However, the number of the first heat sinks may be more than two. On the other hand, the device 11 of FIG. 9 includes one right heat sink 31. However, the number of the second heat sink may be more than one.

Sixth Embodiment

Figure 10:
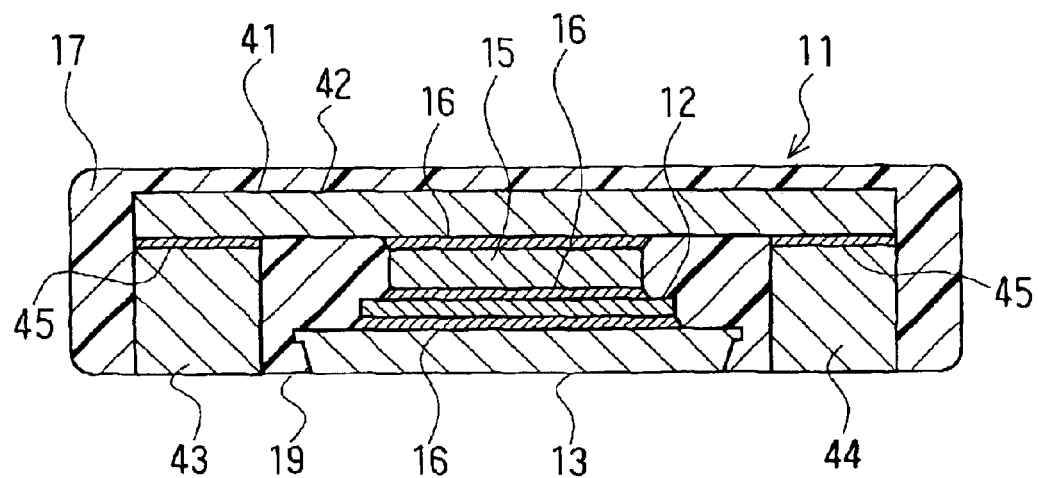
FIG. 10 is a cross-sectional view of a semiconductor device according to a sixth embodiment of the present invention.

As shown in FIG. 10, a semiconductor device 11 according to a sixth embodiment includes a first heat sink 13, or a lower heat sink 13, and a second heat sink 41, or an upper heat sink 41. The upper heat sink 41 includes a metal plate 42 and two metal feet 43, 44. The metal feet 43, 44 have the same function as the extensions 27a of FIG. 6. The metal plate 42 is connected to a coupler 15 using a solder 16, and the metal feet 43, 44 are connected to the metal plate 42 at two horizontal ends of the metal plate 42 using solders 45, as illustrated in FIG. 10.

The metal feet 43, 44 and the lower heat sink 13 are exposed on the lower surface 19 of a mold resin 17 and the exposed surfaces of the metal feet 43, 44 and the lower heat sink 13 are substantially on a common plane. The device 11 of FIG. 10 has substantially the same effect as the device 11 of FIG. 6. However, it is easier to adjust the metal feet 43, 44 and the lower heat sink 13 such that the exposed surfaces of them are substantially on a common plane than to adjust the extensions 27a and the lower heat sink 13 such that the exposed surfaces of them are substantially on a common plane.

In the device 11 of FIG. 10, the upper heat sink 41 is made up of three metal constituents, that is, one metal plate 42 and two metal feet 43, 44. However, the upper heat sink 41 may be made up of two or more than three constituents.

Seventh Embodiment

Figure 11:
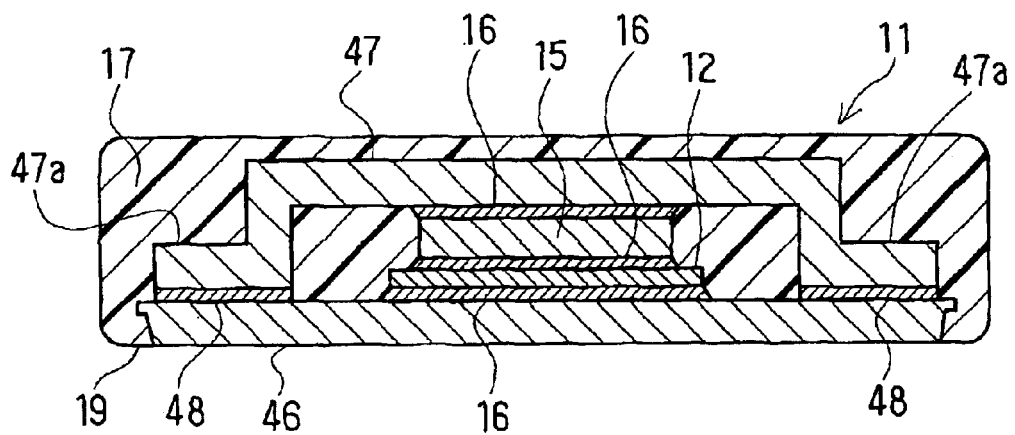
FIG. 11 is a cross-sectional view of a semiconductor device according to a seventh embodiment of the present invention.

As shown in FIG. 11, a semiconductor device 11 according to a seventh embodiment includes a first heat sink 46, or a lower heat sink 46, and a second heat sink 47, or an upper heat sink 47. The upper heat sink 47 includes two extensions 47a at its horizontal two ends, as illustrated in FIG. 11. The upper heat sink 14 is formed, for example, by bending a metal plate. The lower heat sink 46 is exposed on the lower surface 19 of a mold resin 17. Each extension 47a is thermally connected to the lower heat sink 46 by insulating layers 48. The device 11 of FIG. 11 has substantially the same effect as the device 11 of FIG. 6.

Figure 12:
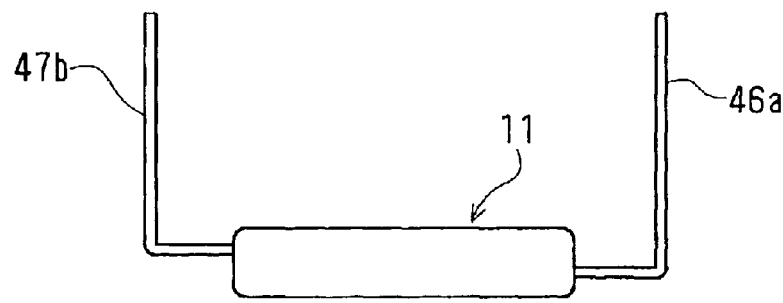
FIG. 12 is a side view of the semiconductor device of FIG. 11.

As illustrated in FIG. 12, the semiconductor device 11 of FIG. 11 includes two terminals 47b, 46a, which protrude from the mold resin 17. Each terminal 47b, 46a includes a horizontal portion and a vertical portion. Although not shown, the vertical portions do not face each other. The upper heat sink 47 is electrically connected to one of the terminals 47b. The lower heat sink 46 is electrically connected to the other terminal 46a.

Each insulating layer 48 includes a ceramic sheet made of, for example, aluminum nitride (AlN) or aluminum oxide ($Al_2O_3$). In the manufacturing process of the device 11, a semiconductor chip 12, a coupler, upper and lower heat sinks 47, 46 are soldered with solders 16 to form a clearance of, for example, about 100 µm between each extension 47a and the lower heat sink 46. Then, a ceramic sheet is interposed between each extension 47a and the lower heat sink 46 with a material such as silicone grease, silicone gel, and silicone adhesive such that the material is located between each extension 47a and the ceramic sheet and between the ceramic sheet and the lower heat sink 46.

Therefore, the insulating layers 48 have preferable insulation capability and heat conductivity. The material, the structure, and the dimension of each insulating layers 48 need to be determined on the basis of the characteristics such as the breakdown voltage and thermal resistance that are required to the insulating layers 48.

In semiconductor device 11 of FIG. 11, it is preferred that the dimensions of the exposed surface of the lower heat sink 46 be large as much as possible. In addition, it is also preferred that the lower surface of each extension 47a, at which each extension 47a is thermally connected to the lower heat sink 46, be large as much as possible.

In the semiconductor device of FIG. 11, each insulating layer 48 is formed using the ceramic sheet and a material such as silicone grease. However, each insulating layer 48 may be formed in other ways. For example, ceramic films are formed beforehand on the lower surfaces of extensions 47a or the upper surface of lower heat sink 46 at the positions where the lower heat sink 46 is thermally connected to each extension 47a. The ceramic films can be formed by thermally spraying a ceramic made of, for example, aluminum nitride (AlN) or aluminum oxide ($Al_2O_3$). Then, each extension 47a and the lower heat sink 46 are thermally connected in the manufacturing process such that a material such as silicone grease, silicone gel, and silicone adhesive is located between the lower heat sink 46 and each ceramic film or between each extension 47a and corresponding ceramic film.

Alternatively, ceramic films are formed beforehand on the lower surfaces of the extensions 47a and the upper surface of the lower heat sink 46. Then, each extension 47a and the lower heat sink 46 are thermally connected in the manufacturing process such that a material such as silicone grease, silicone gel, and silicone adhesive is located between the ceramic film on each extension 47a and corresponding ceramic film on the lower heat sink 46.

Alternatively, each insulating layer 48 may be formed using a resin such as epoxy resin and polyimide resin. Specifically, the resin is placed and cured between each extension 47a and the lower heat sink 46 in the manufacturing process. An inorganic filler may be added to the resin.

Eighth Embodiment

Figure 13:
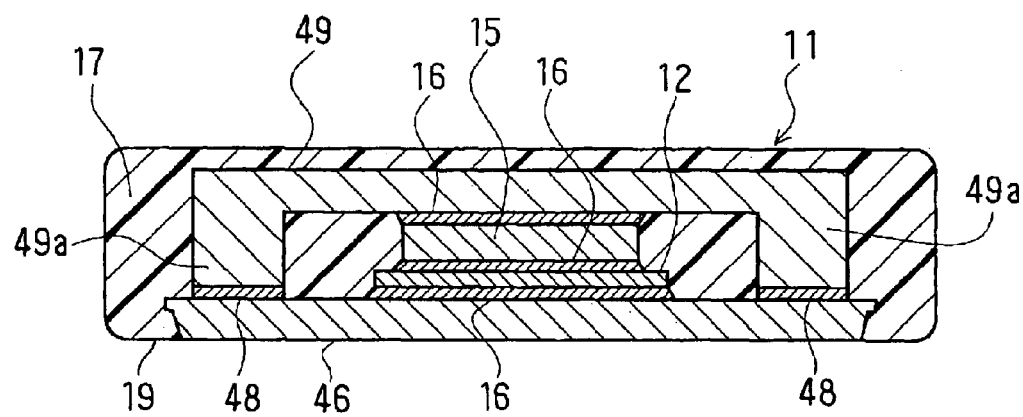
FIG. 13 is a cross-sectional view of a semiconductor device according to an eighth embodiment of the present invention.

As shown in FIG. 13, a semiconductor device 11 according to an eighth embodiment includes a first heat sink 46, or a lower heat sink 46, and a second heat sink 49, or an upper heat sink 49. The upper heat sink 49 includes two extensions 49a at its horizontal two ends, which extend vertically, as illustrated in FIG. 13. The lower heat sink 46 is exposed on the lower surface 19 of a mold resin 17. Each extension 49a is thermally connected to the lower heat sink 46 by insulating layers 48. Therefore, the device 11 of FIG. 13 has substantially the same effect as the device 11 of FIG. 11.

Ninth Embodiment

Figure 14:
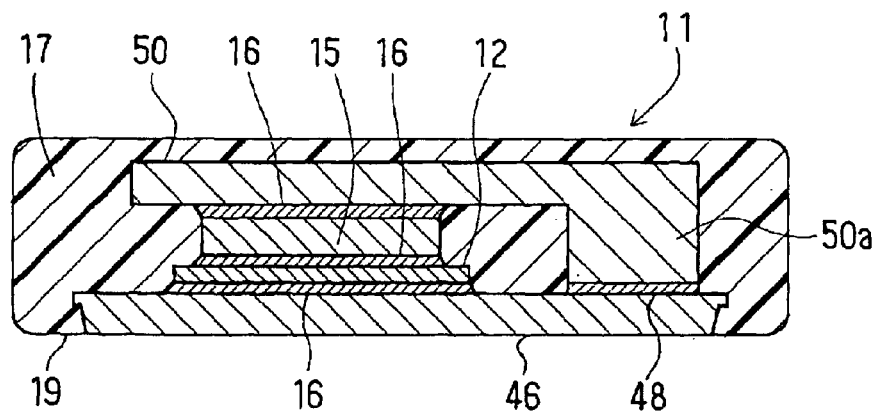
FIG. 14 is a cross-sectional view of a semiconductor device according to a ninth embodiment of the present invention.

As shown in FIG. 14, a semiconductor device 11 according to a ninth embodiment includes a first heat sink 46, or a lower heat sink 46, and a second heat sink 50, or an upper heat sink 50. The upper heat sink 50 includes an extension 50a at its one horizontal end, which extend vertically, as illustrated in FIG. 14. The lower heat sink 46 is exposed on the lower surface 19 of a mold resin 17. The extension 50a is thermally connected to the lower heat sink 46 by an insulating layer 48.

In the semiconductor device 11 of FIG. 13, the heat generated by the semiconductor chip 12 is transmitted to the upper heat sink 49 and further transmitted to the lower heat sink 46 through two extensions 49a. On the other hand, in the semiconductor device 11 of FIG. 14, the heat generated by the semiconductor chip 12 is transmitted to the upper heat sink 50 and further transmitted to the lower heat sink 46 through only one extension 50a.

Nevertheless, the upper heat sink 50 of FIG. 14 has substantially the same thermal conductivity, or heat releasing capability, as the upper heat sink 49 of FIG. 13. The reason is that the upper heat sink 50 of FIG. 14 is thicker than the upper heat sink 49 of FIG. 13 when the heat sinks 50, 49 are compared at the portions parallel to the lower heat sink 46 and the extension 50a of FIG. 14 is wider than the extensions 49a of FIG. 13 when the extensions 50a, 49a are compared in the horizontal direction of FIGS. 13 and 14.

Tenth Embodiment

Figure 15:
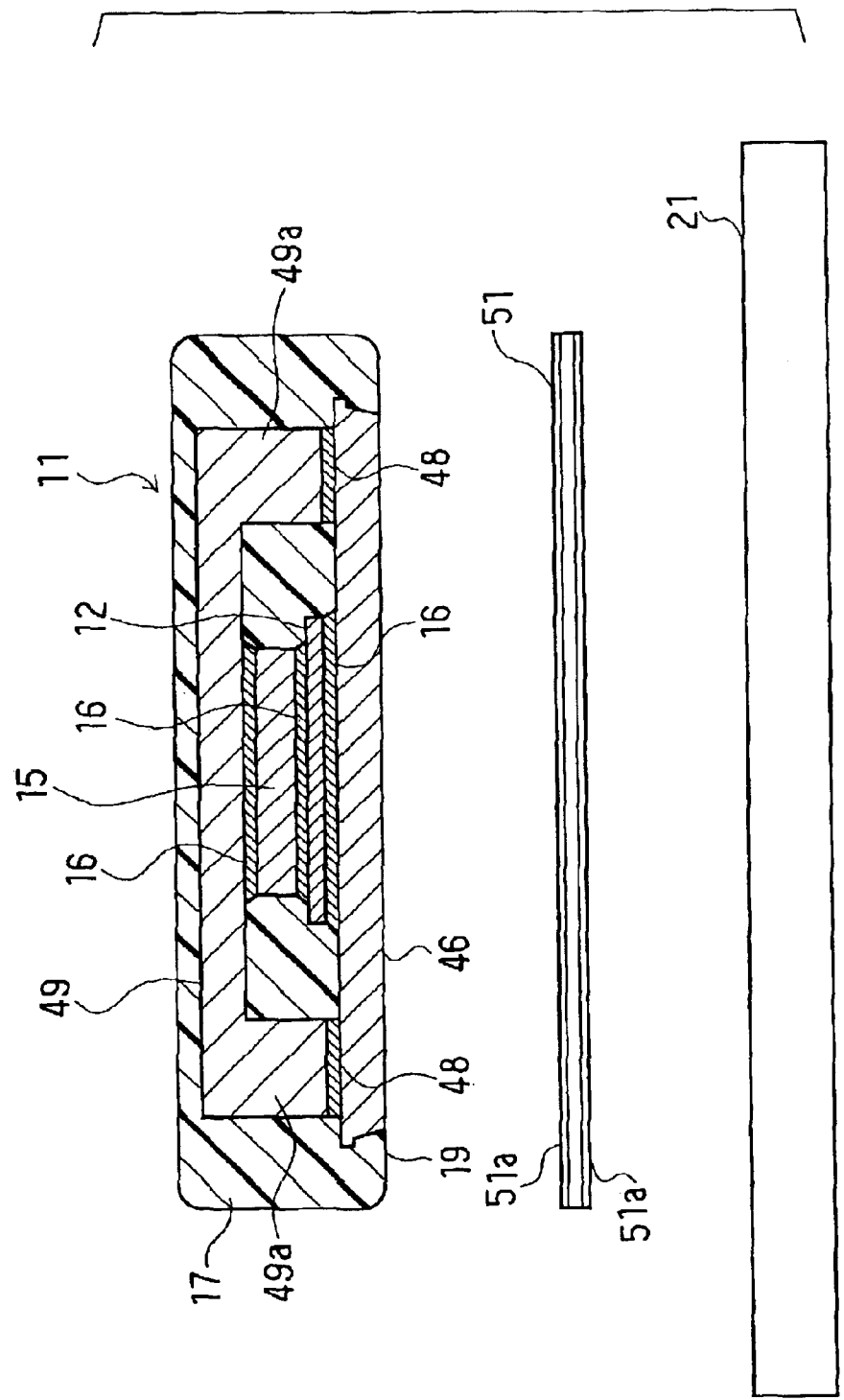
FIG. 15 is an exploded cross-sectional view of an article assembled with the semiconductor device of FIG. 13, an insulating board, and a cooling member.

In the assembled article of FIGS. 4A and 4B, the semiconductor device 11 of FIG. 3 and the cooling member 21 are thermally connected by the insulating sheet 22. However, as shown in FIG. 15, an insulating board 51 may be used instead of the insulating sheet 22. For example, the insulating board 51 includes a ceramic board made of aluminum nitride (AlN) or aluminum oxide ($Al_2O_3$). A material such as silicone grease and silicone gel are coated beforehand on two surfaces of the ceramic board. Then, in the assembling process, the insulating board 51 is placed between the semiconductor device 11 of FIG. 13 and a cooling member 21, as illustrated in FIG. 15.

Instead of being coated on the ceramic board, the material may be coated on the upper surface of the cooling member 21, at which the cooling member 21 is thermally connected to the ceramic board, and the exposed surface of the lower heat sink 46.

Eleventh Embodiment

Figure 16:
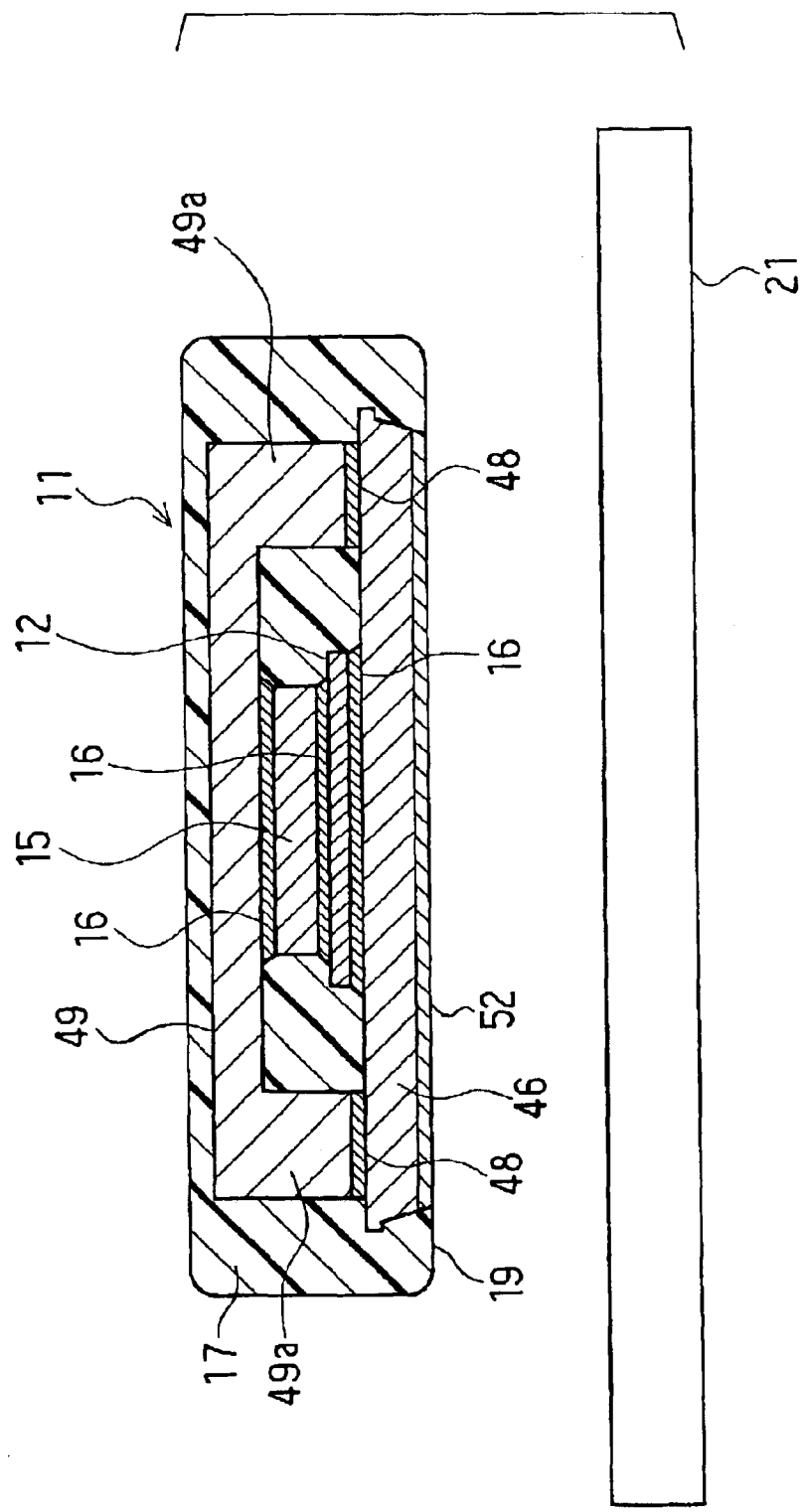
FIG. 16 is an exploded cross-sectional view of an article assembled with the semiconductor device according to an eleventh embodiment of the present invention and a cooling member.

In the assembled article of FIG. 15, the insulating board 51 is used to insulate the lower heat sink 46 and the cooling member 21 while thermally connecting them. However, as shown in FIG. 16, an insulating layer 52 may be used instead of the insulating board 51. For example, the insulating layer 52 includes a ceramic board made of aluminum nitride (AlN) or aluminum oxide ($Al_2O_3$). The ceramic board is plastered on the lower surface of the lower heat sink 46, at which the lower heat sink 46 is thermally connected to the cooling member 21.

Instead, the insulating layer 52 may be formed on the upper surface of the lower heat sink 46 by thermally spraying a ceramic material. Alternatively, the insulating layer 52 may be formed using a resin such as epoxy resin and polyimide resin. An inorganic filler may be added to the resin.

When the semiconductor device 11 is fixed to the cooling member 21 in the manufacturing process, it is preferred that a material such as silicone grease, silicone gel, and silicone adhesive be placed between the insulating layer 52 and the cooling member 21. The assembled article of FIG. 16 has substantially the same effect as that of FIG. 15.

Twelfth Embodiment

Figure 17:
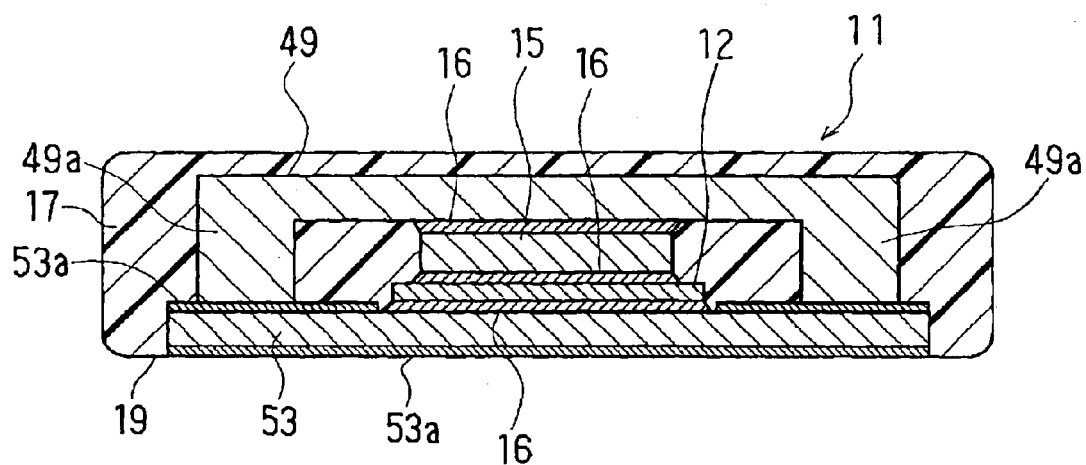
FIG. 17 is a cross-sectional view of a semiconductor device according to a twelfth embodiment of the present invention.

As shown in FIG. 17, a semiconductor device 11 according to a twelfth embodiment includes a first heat sink 53, or a lower heat sink 53, that includes a metal plate and insulating layers 53a, each of which is located on the upper and lower surfaces of the lower heat sink 53. Each insulating layers 53a of FIG. 17 is formed in the same manner as the insulating layer 52 of FIG. 16.

Figure 18:
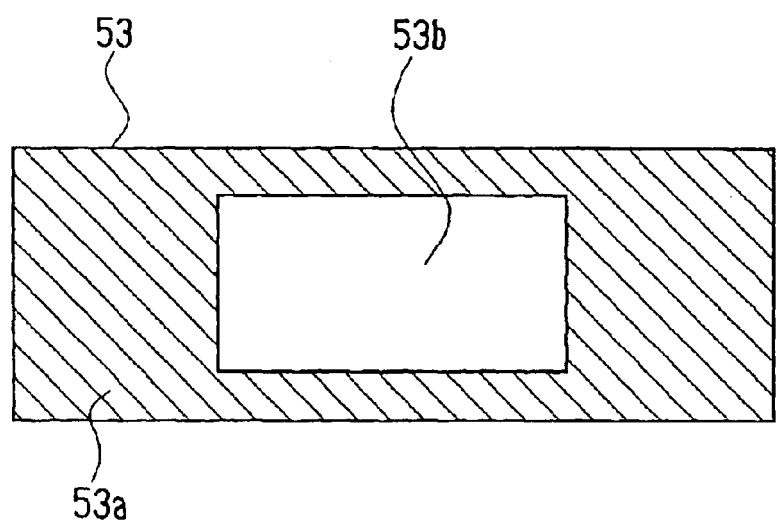
FIG. 18 is a plan view of the lower heat sink of FIG. 17.

As illustrated in FIG. 18, the metal plate is exposed at the area 53B where a semiconductor chip 12 is electrically connected to the lower heat sink 53. The device 11 of FIG. 17 has substantially the same heat releasing capability as the device 11 of FIG. 13. In addition to that, with the insulating layer 53a on the lower surface of the lower heat sink 53, no insulating sheet 22 needs to be placed between the semiconductor device 11 of FIG. 17 and a cooling member 21 when the device 11 and the cooling member 21 are thermally connected as in the assembled article of FIGS. 4A and 4B.

What is claimed is:

1. A power semiconductor device comprising:
  a semiconductor chip, which generates heat;
  a first heat sink, which is electrically and thermally connected to a first surface of the semiconductor chip for functioning as an electrode for the semiconductor chip and releasing the heat;
  a second heat sink, which is electrically and thermally connected to a second surface of the semiconductor chip for functioning as an electrode for the semiconductor chip and releasing the heat; and
  a mold resin, wherein the semiconductor chip and the heat sinks are covered with the mold resin such that the heat sinks are exposed on one surface of the mold resin, wherein the one surface is a substantially flat surface, and wherein the first heat sink and the second heat sink are bonded via an insulating sheet on a cooling member.

2. The semiconductor device in claim 1, wherein two ends of the second heat sink are exposed on the substantially flat surface.

3. A power semiconductor device comprising:
  a semiconductor chip, which generates heat;
  a first heat sink, which is electrically and thermally connected to a first surface of the semiconductor chip for functioning as an electrode for the semiconductor chip and releasing the heat;
  a second heat sink, which is electrically and thermally connected to a second surface of the semiconductor chip for functioning as an electrode for the semiconductor chip and releasing the heat; and
  a mold resin, wherein the semiconductor chip and the heat sinks are covered with the mold resin such that the heat sinks are exposed on one surface of the mold resin, wherein the one surface is a substantially flat surface, wherein the first heat sink and the second heat sink are bonded via an insulating sheet on a cooling member,
  wherein the first and second surfaces of the semiconductor chip are substantially perpendicular to the substantially flat surface.

4. A power semiconductor device comprising:
  a semiconductor chip, which generates heat;
  a first heat sink, which is electrically and thermally connected to a first surface of the semiconductor chip for functioning as an electrode for the semiconductor chip and releasing the heat;
  a second heat sink, which is electrically and thermally connected to a second surface of the semiconductor chip for functioning as an electrode for the semiconductor chip and releasing the heat; and
  a mold resin, wherein the semiconductor chip and the heat sinks are covered with the mold resin such that the heat sinks are exposed on one surface of the mold resin, wherein the one surface is a substantially flat surface, wherein the first heat sink and the second heat sink are bonded via an insulating sheet on a cooling member,
  wherein the first and second surfaces of the semiconductor chip are slanted in relation to the substantially flat surface.

5. A power semiconductor device comprising:
  a semiconductor chip, which generates heat;
  a first heat sink, which is electrically and thermally connected to a first surface of the semiconductor chip for functioning as an electrode for the semiconductor chip and releasing the heat;
  a second heat sink, which is electrically and thermally connected to a second surface of the semiconductor chip for functioning as an electrode for the semiconductor chip and releasing the heat; and
  a mold resin, wherein the semiconductor chip and the heat sinks are covered with the mold resin such that the heat sinks are exposed on one surface of the mold resin, wherein the one surface is substantially flat surface, wherein the first heat sink and the second heat sink are bonded via an insulating sheet on a cooling member,
  another semiconductor chip, which generates heat.

6. The semiconductor device in claim 5, further comprising:
   another first heat sink, wherein the another first heat sink is electrically and thermally connected to a first surface of the another semiconductor chip for functioning as an electrode for the another semiconductor chip and releasing the heat generated by the another semiconductor chip, wherein the second heat sink is electrically and thermally connected to a second surface of the another semiconductor chip for functioning as an electrode for the another semiconductor chip and releasing the heat generated by the another semiconductor chip, and wherein the another semiconductor chip and the another first heat sink are covered with the mold resin such that the another first heat sink is exposed on the substantially flat surface.

7. The semiconductor device in claim 1, wherein the second heat sink is made up of a plurality of metal constituents.

8. A semiconductor device comprising:
   a semiconductor chip, which generates heat;
   a first heat sink, which is electrically and thermally connected to a first surface of the semiconductor chip for functioning as an electrode for the semiconductor chip and releasing the heat;
   a second heat sink, which is electrically and thermally connected to a second surface of the semiconductor chip for functioning as an electrode for the semiconductor chip and releasing the heat;
   an insulating layer, which is located between the heat sinks; and
   a mold resin, wherein the semiconductor chip, the heat sinks, and the insulating layer are covered with the mold resin such that one of the heat sinks is exposed on a substantially flat surface of the mold resin and wherein the heat sinks are thermally connected by the insulating layer.

9. The semiconductor device in claim 8, wherein the first heat sink is in the shape of a plate, wherein the first heat sink is exposed on the substantially flat surface, and wherein two ends of the second heat sink are thermally connected to the first heat sink.

10. The semiconductor device in claim 8, further comprising another insulating layer, which is located on an exposed surface of the first heat sink.

11. A power semiconductor device comprising:
   a semiconductor chip, which generates heat;
   a first heat sink, which is electrically and thermally connected to a first surface of the semiconductor chip for functioning as an electrode for the semiconductor chip and releasing the heat;
   second heat sink, which is electrically and thermally connected to a second surface of the semiconductor chip for functioning as an electrode for the semiconductor chip and releasing the heat; and
   a mold resin, wherein the semiconductor chip and the heat sinks are covered with the mold resin such that the heat sinks are exposed on one surface of the mold resin, wherein the one surface is a substantially flat surface, wherein the first heat sink and the second heat sink are bonded via an insulating sheet on a cooling member,
   wherein the second heat sink has two ends, one end being attached to the first surface of the semiconductor chip and the other end being exposed on the substantially flat surface.

12. The semiconductor device in claim 1, wherein the second heat sink has one center portion and at least one end portion, the center portion being attached to the second surface of the semiconductor chip and the at least one end portion being exposed on the substantially flat surface.

13. The semiconductor device in claim 1, wherein the first and second surfaces of the semiconductor chip are substantially parallel to the substantially flat surface.

14. The semiconductor device in claim 8, wherein the first and second surfaces of the semiconductor chip are substantially parallel to the substantially flat surface.

15. A semiconductor package, comprising:
   a semiconductor chip;
   a first heat sink electrically and thermally connected to a first surface of the semiconductor chip for functioning as an electrode for the semiconductor chip and for releasing heat generated by the semiconductor chip;
   a second heat sink electrically and thermally connected to a second surface of the semiconductor chip for functioning as an electrode for the semiconductor chip and for releasing the heat generated by the semiconductor chip; and
   a mold resin covering the semiconductor chip and the heat sinks such that the first heat sink is exposed on one substantially flat surface defined by the mold resin,
   wherein the second heat sink includes a center portion attached to the second surface of the semiconductor chip and at least one end portion attached to a surface of the first heat sink.

16. The semiconductor device as in claim 15, further comprising an insulating board and a cooling member, wherein the insulating board is located between the one surface of the mold resin and the cooling member.

17. The semiconductor device as in claim 15, further comprising a cooling member attached to the one substantially flat surface defined by the mold resin.

18. The semiconductor device as in claim 15, further comprising an insulating layer on a lower surface of the first heat sink.

19. The semiconductor device as in claim 15, further comprising an insulating layer located between the first and second heat sinks.

* * * * *